US012174909B2

(12) United States Patent
La Rosa et al.

(10) Patent No.: US 12,174,909 B2
(45) Date of Patent: Dec. 24, 2024

(54) METHOD AND APPARATUS FOR CONVOLUTIONAL COMPUTATION BASED ON FLOATING GATE NVM ARRAY

(71) Applicants: STMicroelectronics S.r.l., Agrate Brianza (IT); STMicroelectronics (Rousset) SAS, Rousset (FR)

(72) Inventors: Francesco La Rosa, Rousset (FR); Antonino Conte, Tremestieri Etneo (IT)

(73) Assignees: STMicroelectronics S.r.l., Agrate Brianza (IT); STMicroelectronics (Rousset) SAS, Rousset (FR)

( * ) Notice: Subject to any disclaimer, the term of this patent is extended or adjusted under 35 U.S.C. 154(b) by 783 days.

(21) Appl. No.: 17/373,935

(22) Filed: Jul. 13, 2021

(65) Prior Publication Data

US 2022/0043885 A1    Feb. 10, 2022

(30) Foreign Application Priority Data

Aug. 5, 2020    (FR) ..................... 2008286

(51) Int. Cl.
*G06F 17/15*    (2006.01)
*G11C 16/04*    (2006.01)
(Continued)

(52) U.S. Cl.
CPC ........ *G06F 17/153* (2013.01); *G11C 16/0408* (2013.01); *G11C 16/10* (2013.01); *G11C 16/26* (2013.01); *G11C 16/30* (2013.01); *G11C 16/32* (2013.01); *G06N 3/02* (2013.01); *H03K 19/20* (2013.01)

(58) Field of Classification Search
CPC ........ G06F 17/153; G06F 17/16; G06F 7/523; G06F 7/4983; G11C 16/0408; G11C 16/10; G11C 16/26; G11C 16/30; G11C 16/32; G11C 11/5628; G11C 11/54;
(Continued)

(56) References Cited

U.S. PATENT DOCUMENTS 5,353,382 A    10/1994  Yariv et al.
9,864,950 B2 *  1/2018  Datta ..................... G06N 3/063
(Continued)

OTHER PUBLICATIONS

Hasler, Paul, et al., "An Analog Floating-Gate Node for Supervised Learning", IEEE Transactions on Circuits and Systems—I: Regular Papers, vol. 25, No. 5, May 2005, pp. 834-845.
(Continued)

*Primary Examiner* — Tan V Mai
(74) *Attorney, Agent, or Firm* — Slater Matsil, LLP

(57) ABSTRACT

In an embodiment a method programming floating gate transistors belonging to non-volatile memory cells to multilevel threshold voltages respectively corresponding to the weight factors, performing a sensing operation of the programmed floating gate transistors with a control signal adapted to make the corresponding memory cells become conductive at an instant determined by a respective programmed threshold voltage, performing the convolutional computation by using the input values during an elapsed time for each memory cell to become conductive and outputting output values resulting from the convolutional computation.

20 Claims, 12 Drawing Sheets

(51) Int. Cl.
  *G11C 16/10*  (2006.01)
  *G11C 16/26*  (2006.01)
  *G11C 16/30*  (2006.01)
  *G11C 16/32*  (2006.01)
  *G06N 3/02*   (2006.01)
  *H03K 19/20*  (2006.01)

(58) Field of Classification Search
  CPC ....... G11C 11/5642; G11C 5/147; G11C 7/06;
         H03K 19/20; G06N 3/065; G06N 3/063
  USPC ......................................................... 708/190
  See application file for complete search history.

(56) References Cited

U.S. PATENT DOCUMENTS

| | | | |
|---|---|---|---|
| 10,719,296 B2 * | 7/2020 | Lee ........................ | G11C 11/54 |
| 10,957,392 B2 * | 3/2021 | Lee ........................ | G11C 16/26 |
| 10,991,430 B2 * | 4/2021 | Lai ........................ | G06F 3/0683 |
| 2016/0048755 A1 | 2/2016 | Freyman et al. | |
| 2018/0095722 A1 | 4/2018 | Buchanan et al. | |
| 2018/0174034 A1 * | 6/2018 | Obradovic ............. | H10B 41/30 |
| 2020/0020393 A1 | 1/2020 | Al-Shamma | |
| 2020/0119028 A1 | 4/2020 | Tran et al. | |

OTHER PUBLICATIONS

Agarwal, Sapan, et al., "Using Floating-Gate Memory to Train Ideal Accuracy Neural Networks", IEEE Journal on Exploratory Solid-State Computational Devices and Circuits, vol. 5, No. 1, Jun. 2019, pp. 52-57.

* cited by examiner

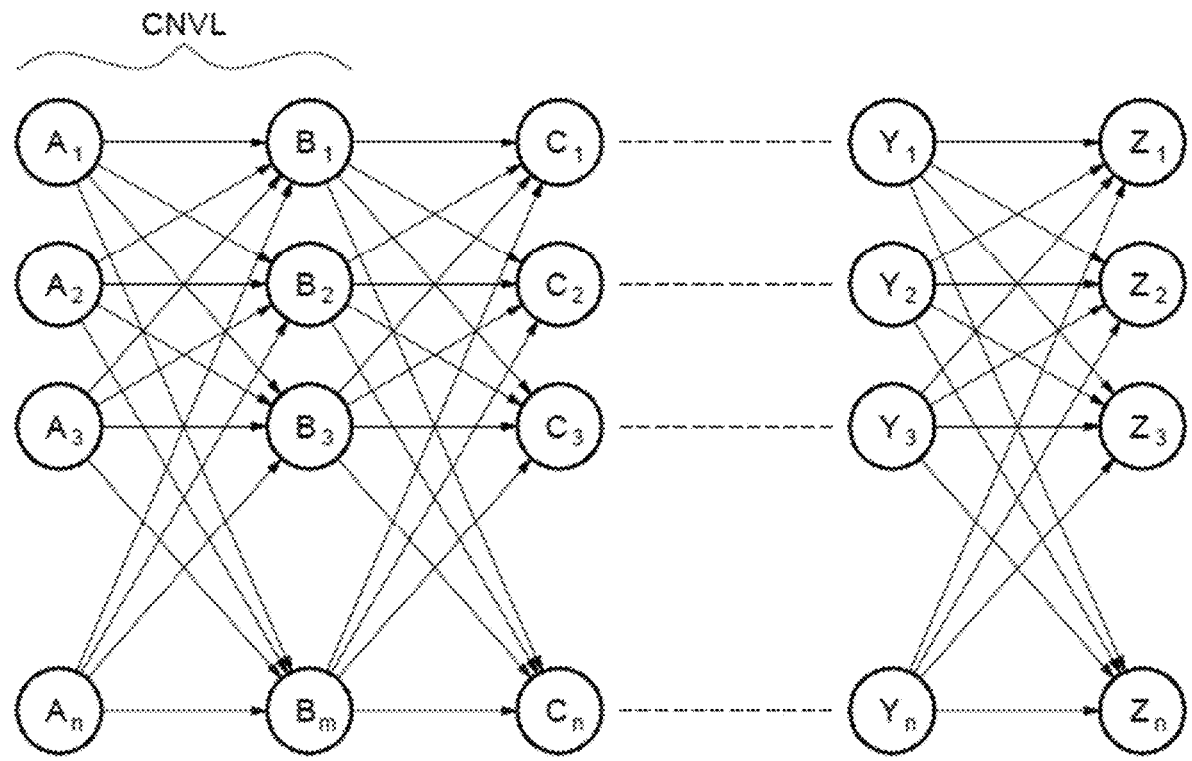
[Fig 1]
[Fig 2]

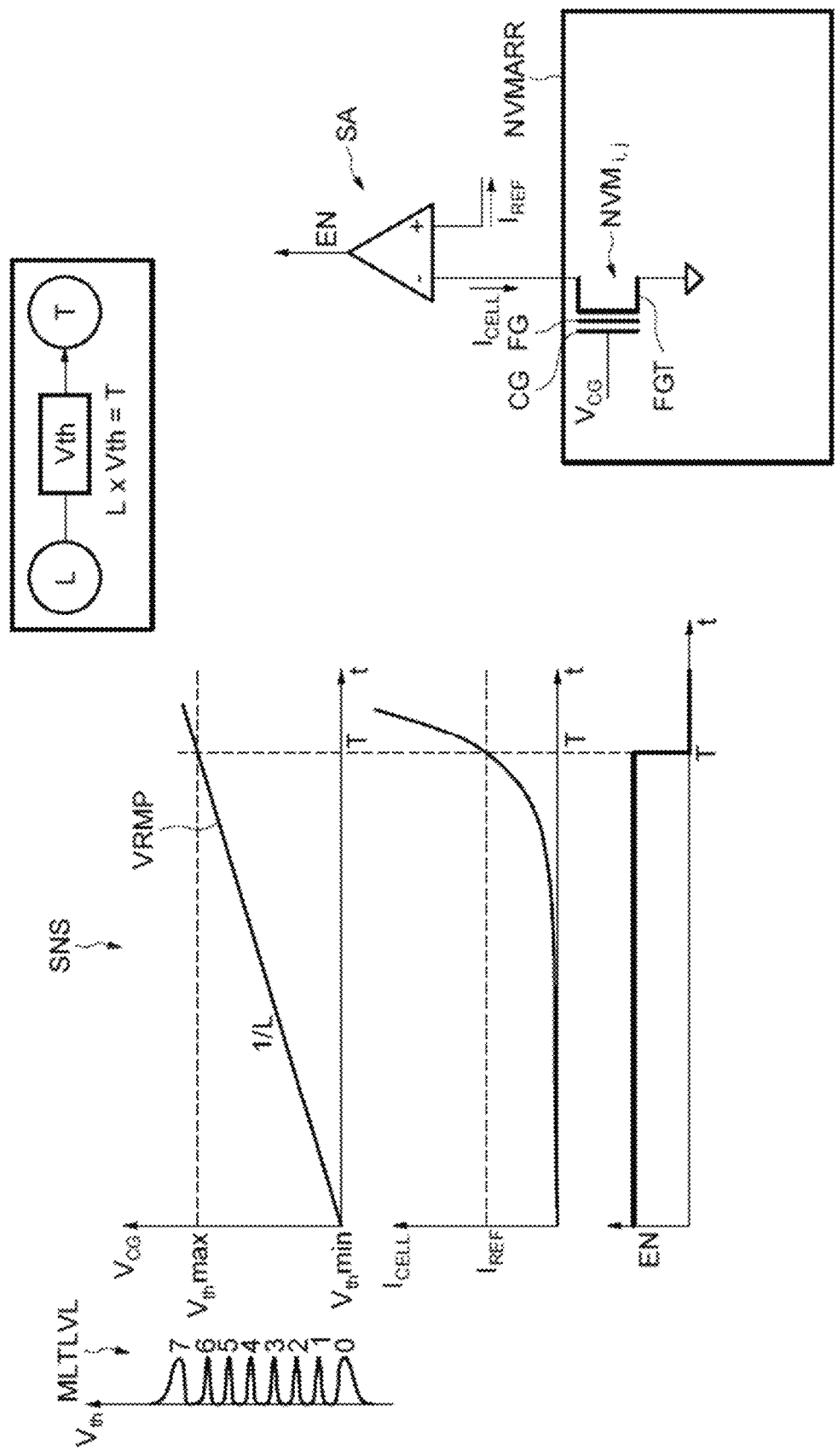

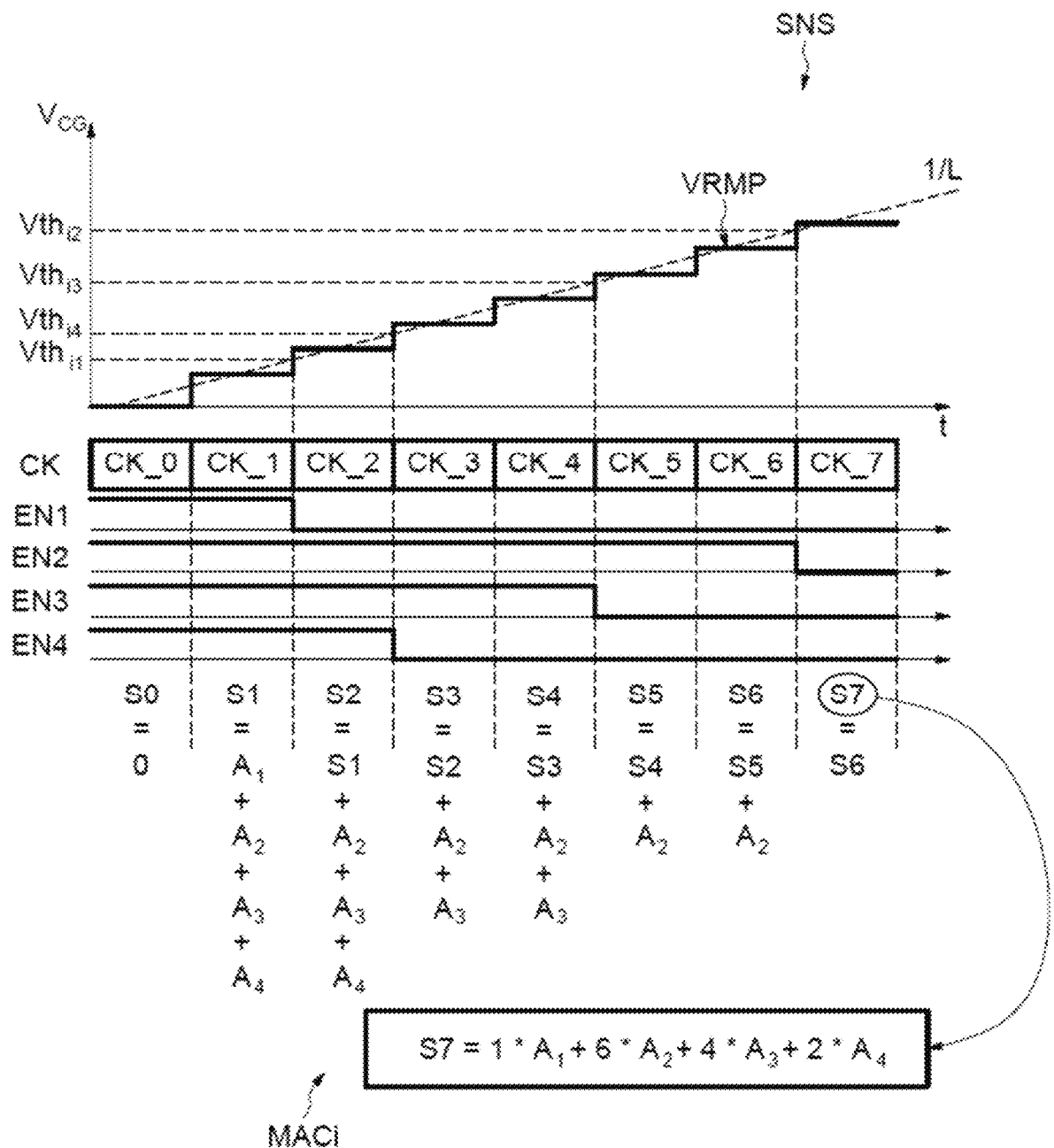

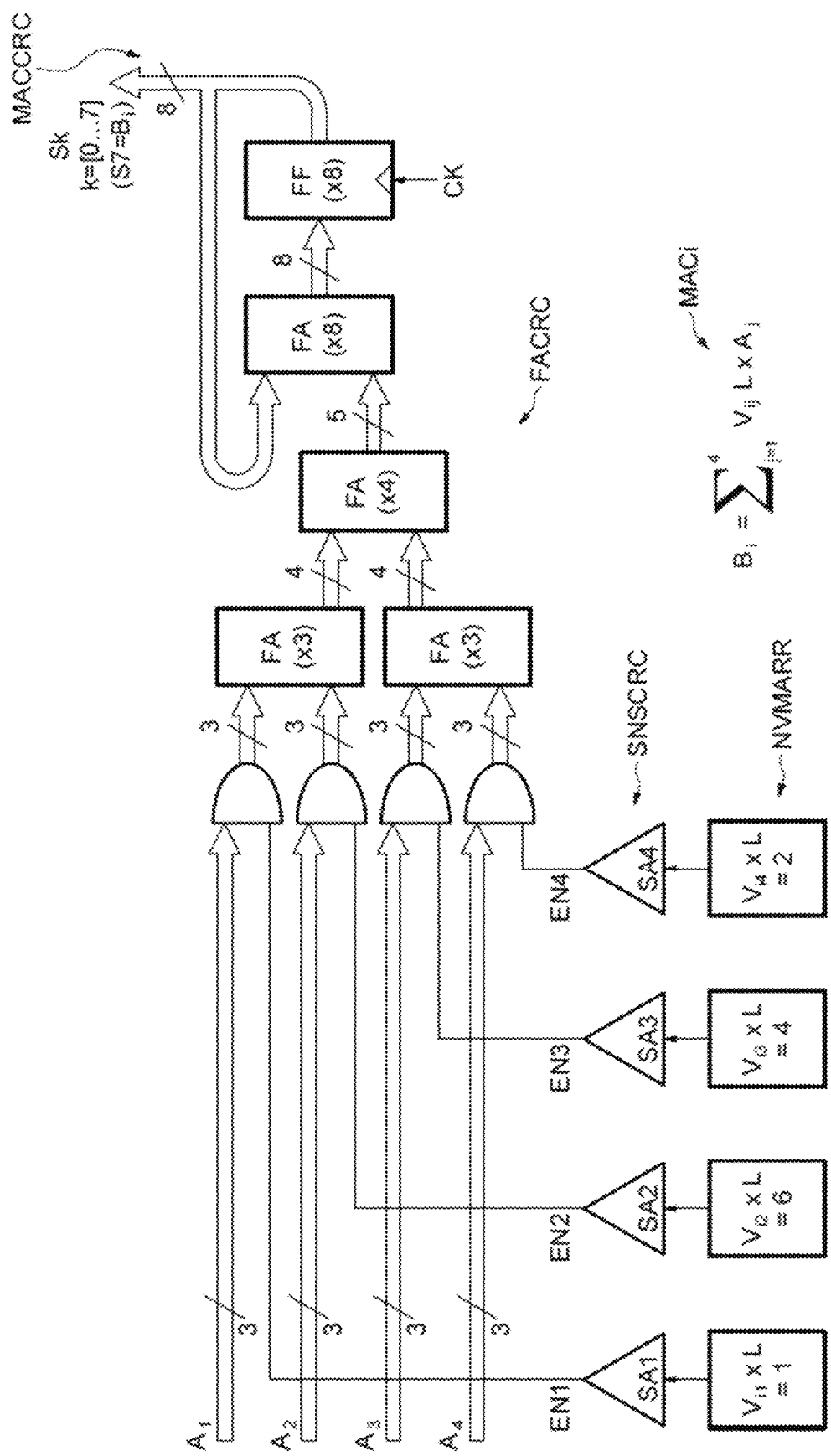

[Fig 6]

$$\begin{pmatrix} V_{11} & V_{12} & V_{13} & V_{14} \\ V_{21} & \vdots & \cdots & \vdots \\ V_{31} & \vdots & V_{ij} & \vdots \\ V_{41} & & \cdots & V_{44} \end{pmatrix} \times L \times \begin{pmatrix} A_1 \\ A_2 \\ A_3 \\ A_4 \end{pmatrix} = \begin{pmatrix} B_1 \\ B_2 \\ B_3 \\ B_4 \end{pmatrix}$$

MTX OP  VECTIN  VECTOUT

CNVL

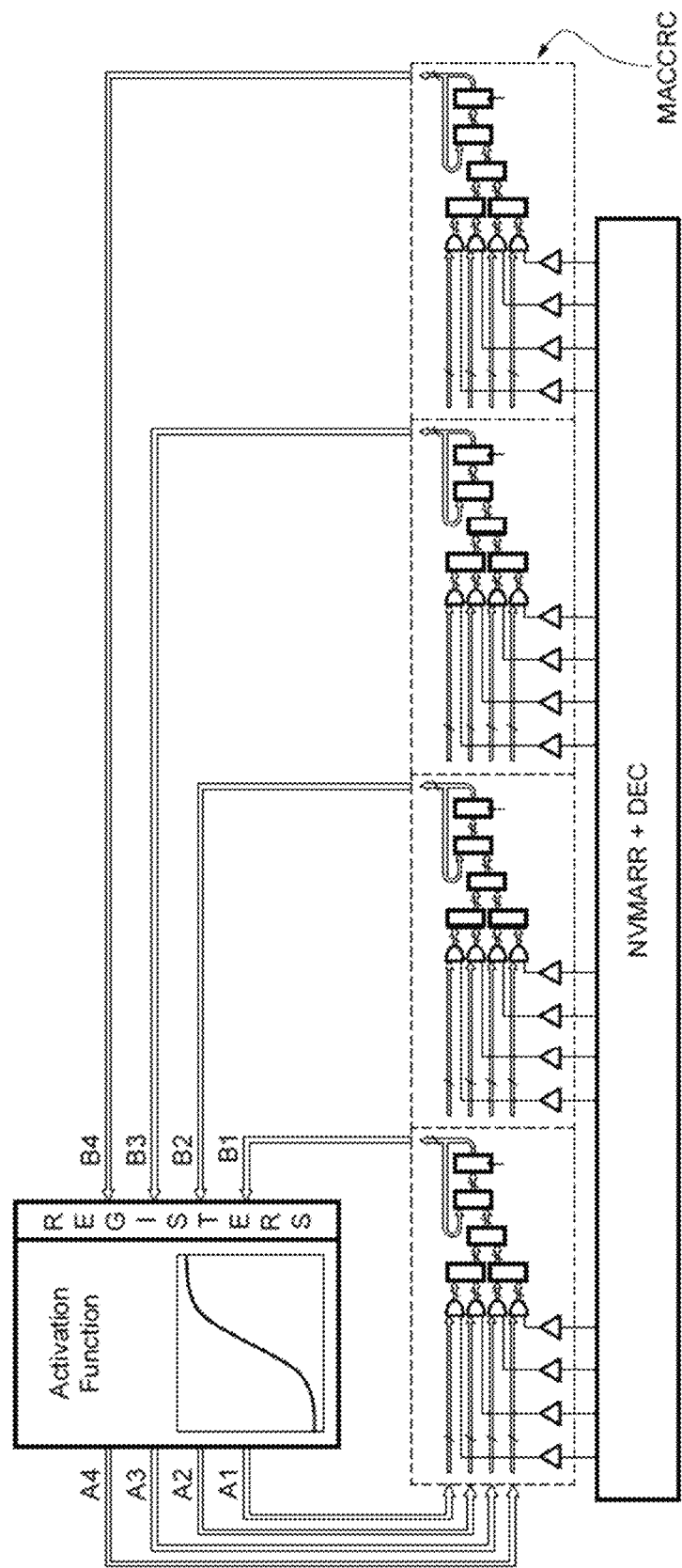
[FIG. 7]

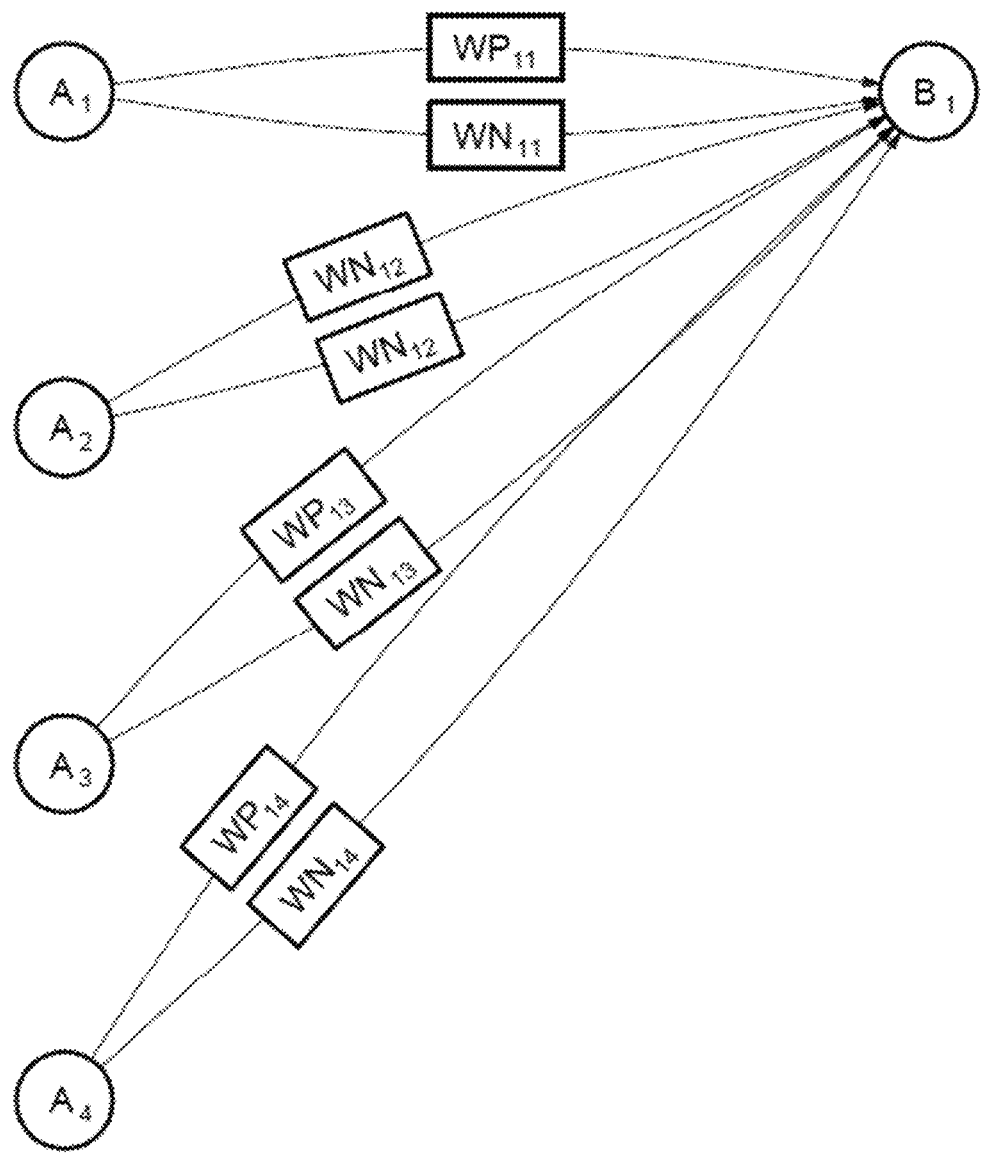

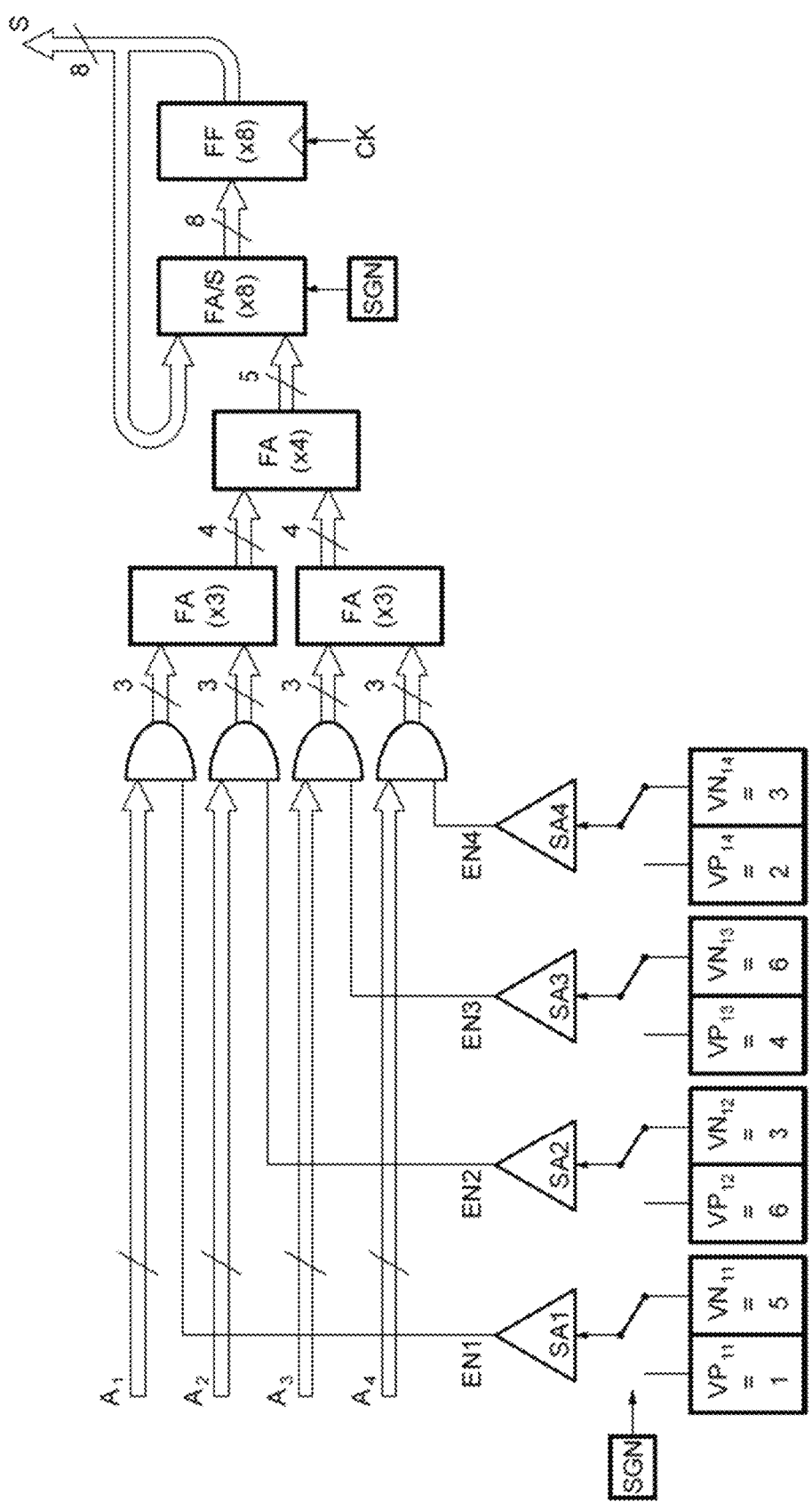
[FIG. 9]

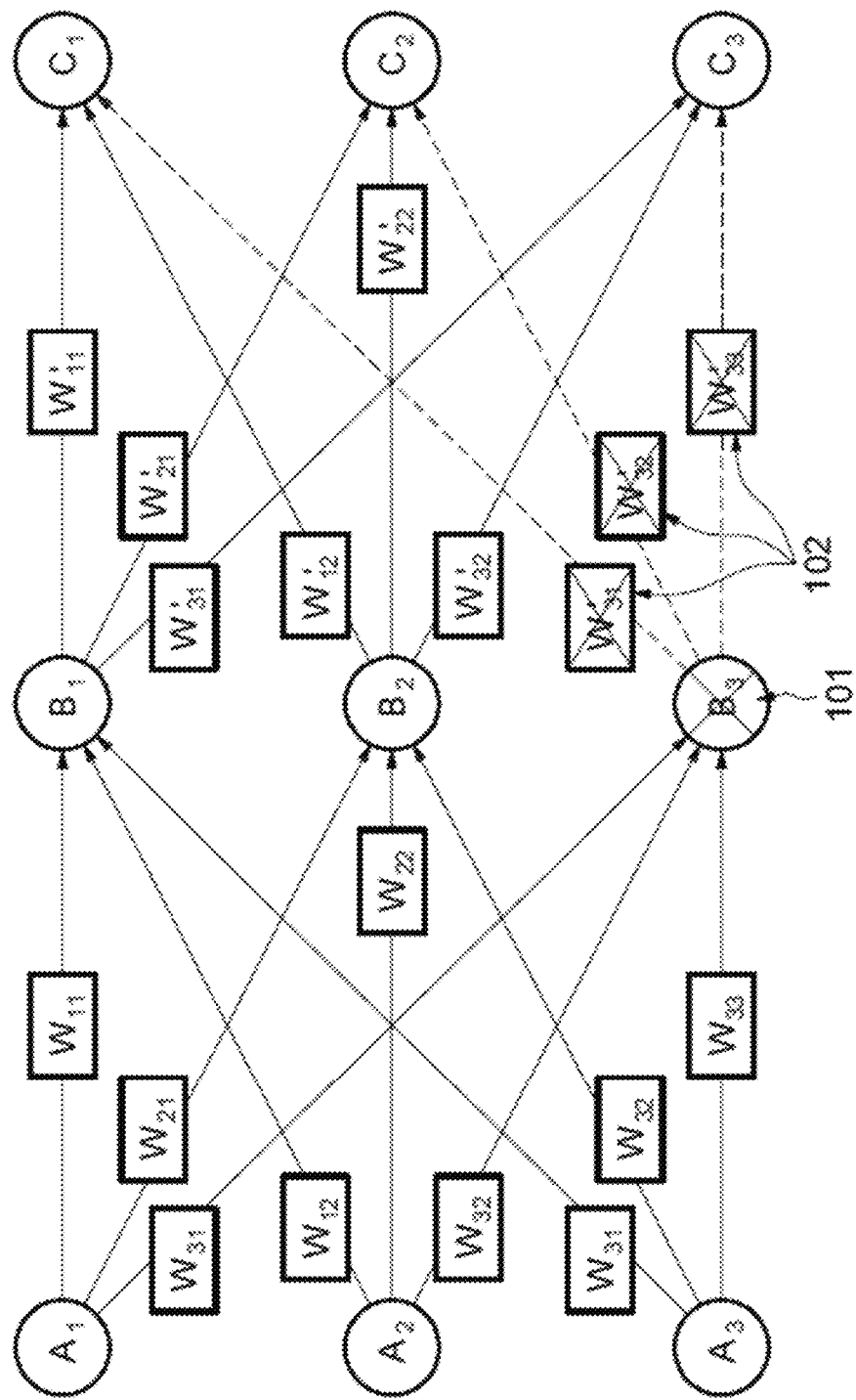

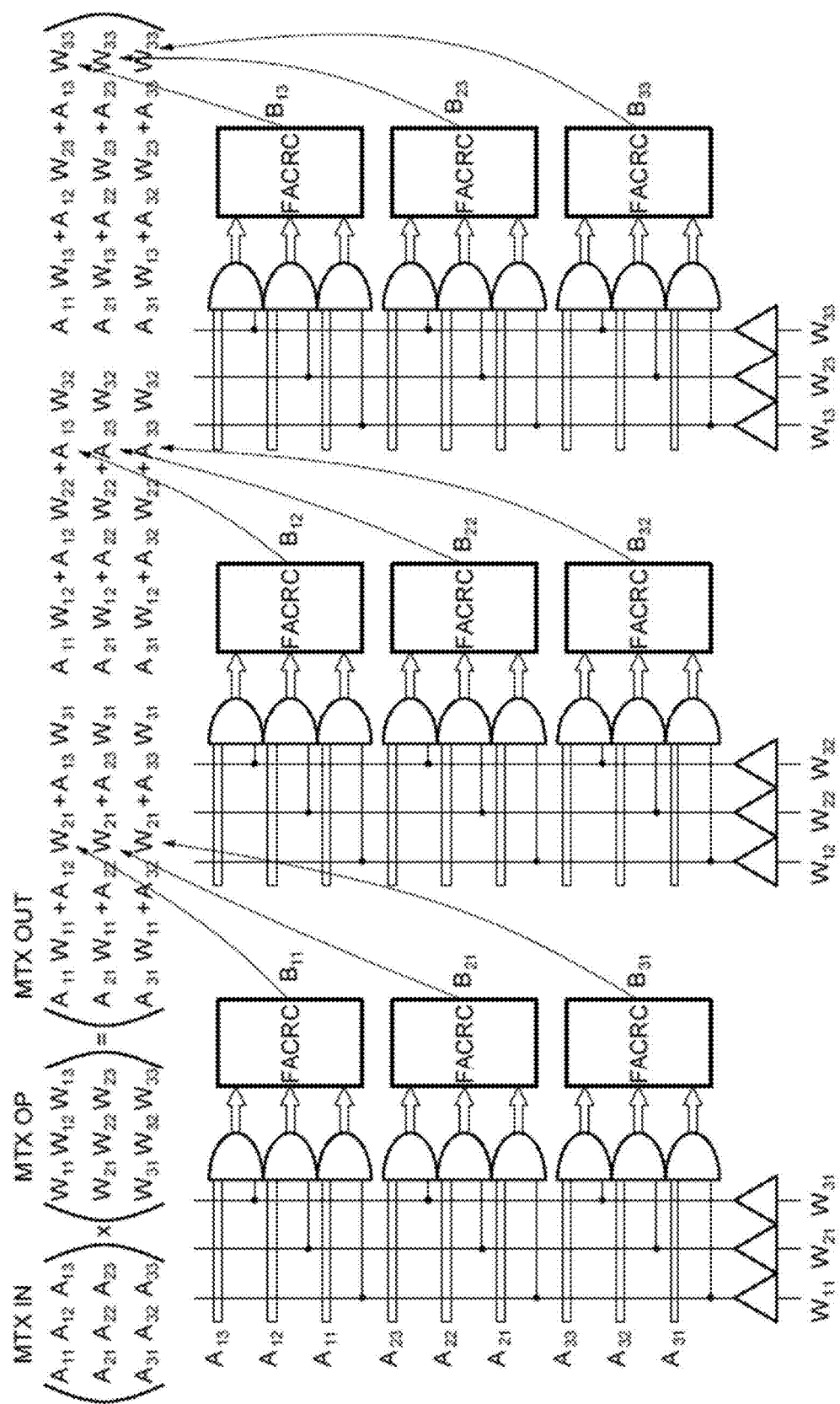

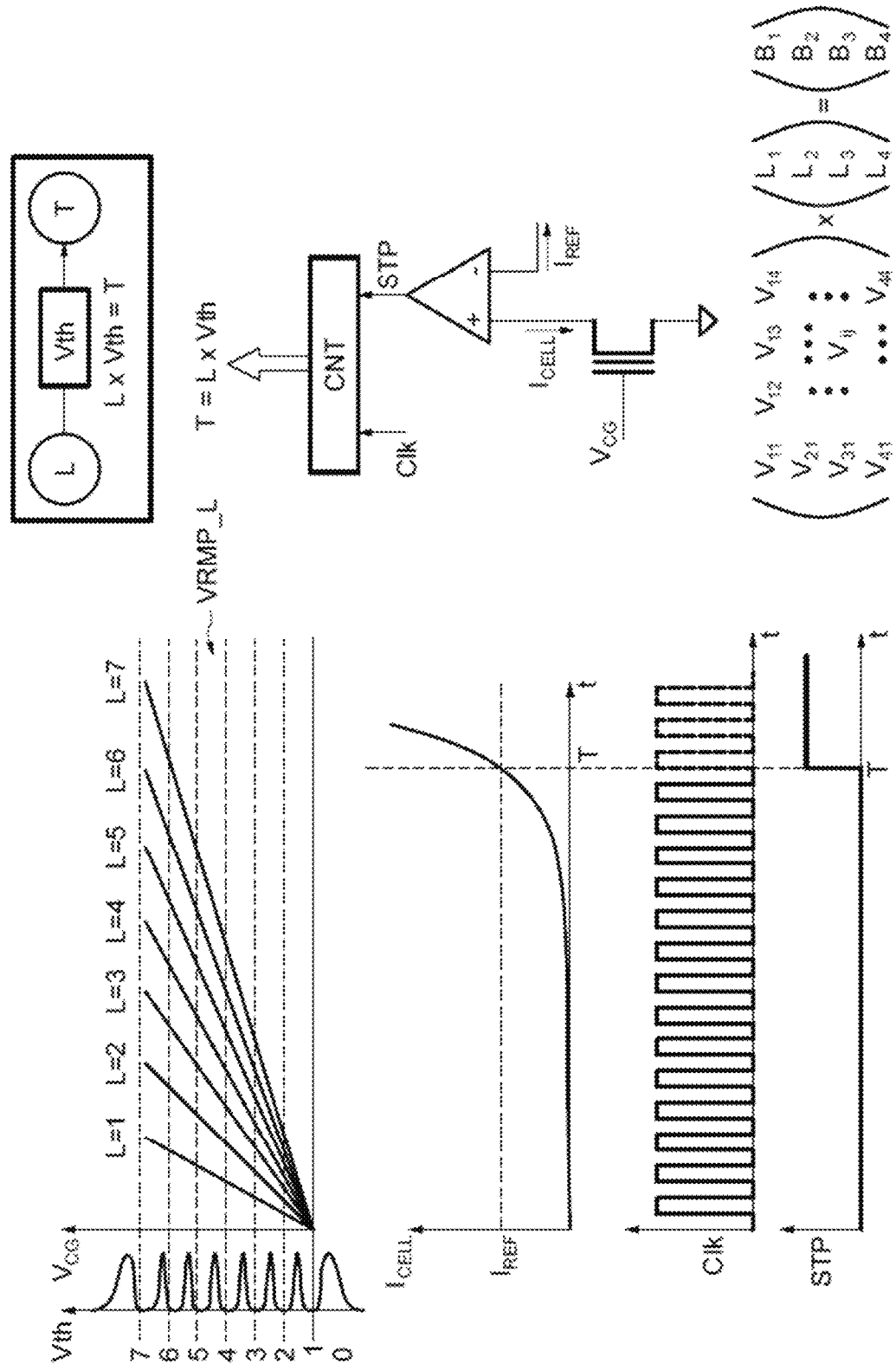
[FIG. 12]

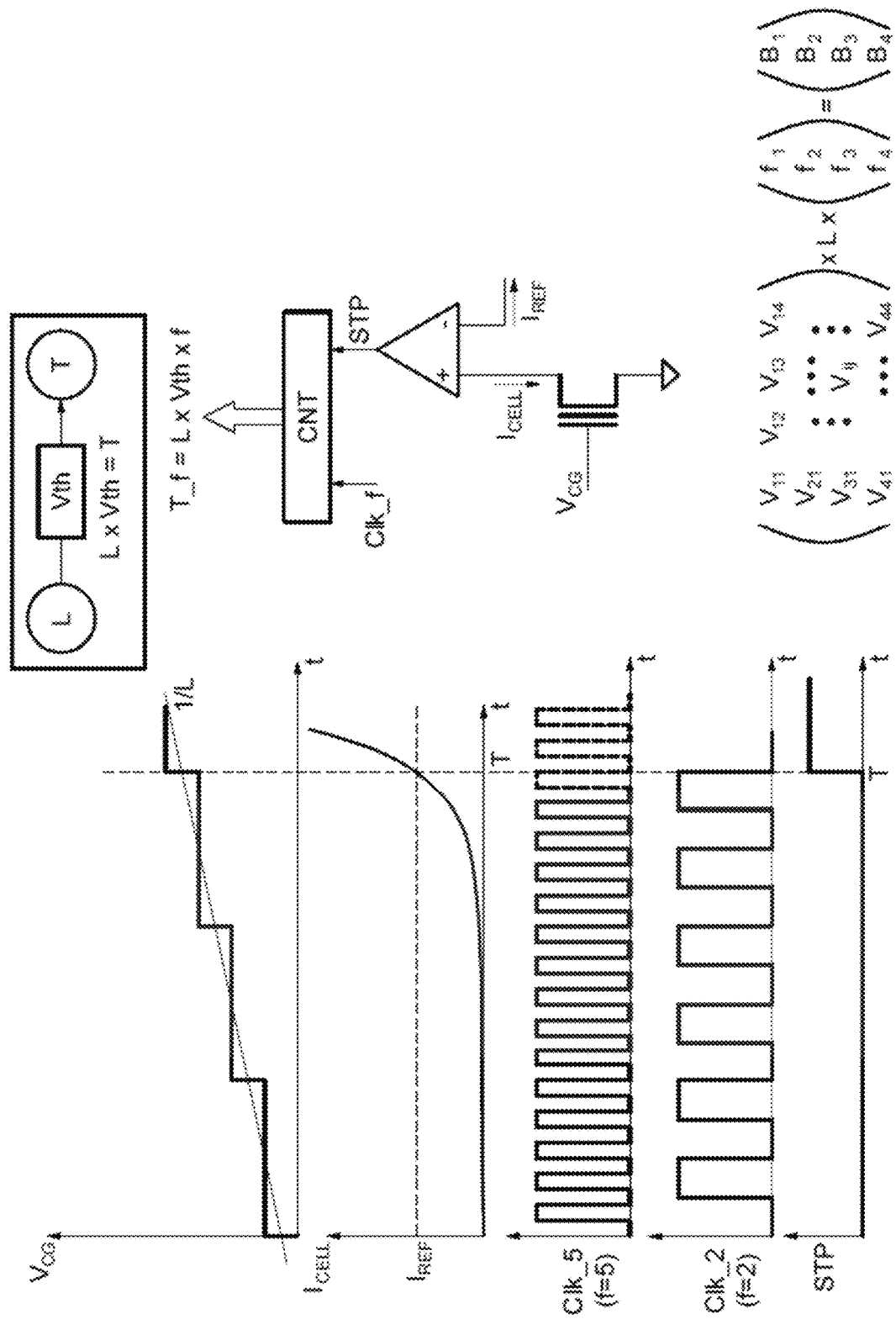
[FIG. 13]

METHOD AND APPARATUS FOR CONVOLUTIONAL COMPUTATION BASED ON FLOATING GATE NVM ARRAY

CROSS-REFERENCE TO RELATED APPLICATIONS

This application claims the benefit of French Patent Application No. 2008286, filed on Aug. 5, 2020, which application is hereby incorporated herein by reference.

TECHNICAL FIELD

This application relates to convolutional computation, in particular to an in-memory calculation, for instance convolutional computation between layers of a neural network.

BACKGROUND

In the neural network technical field, the term "convolutional computation" designates a computation between an input space of a finite number of input values to an output space of a finite number of output values, where the calculation of each output value uses all the input values. The most convenient mathematical expression for such a calculation is a matrical product of a convolutional matrix operator with a vector of the input values, resulting in a vector of the output values. The output values are thus each obtained by a multiply and accumulate operation.

The term "in-memory computations" designates computations performed in real-time in a circuit storing the parameters of the calculations (called memory), and basically differs from classical computations because in-memory computations do not need to transfer values and parameters from a memory to a processing unit, which would perform the calculations. Moreover, processing units are typically limited in the number of elementary operations able to be computed at the same time, while in-memory computations generally compute all the results and provides them at once, independently of the quantity of calculated elements, in accordance with the limited capability of the in-memory computer.

Classical in-memory computations are performed by means of a resistive memory array, where each memory point has a resistive value that has been programmed according to the parameters of the calculation. The digital input values are converted into voltage signals applied on raw lines of memory points, wherein a current with an intensity according to Ohm's law flows through each memory point. The currents flowing through column lines are summed by Kirchhoff's law and are converted into digital output values, each output value thus resulting from a multiply and accumulate operation of the input values.

This type of conventional technique suffers from the need for both the input converter circuit (digital-to-voltage) and the output converter circuit (current-to-digital) to deliver very accurate results over a large dynamic range. Consequently, these input/output converter circuits typically have complex designs and large sizes, and introduce extra costs.

SUMMARY

Embodiments provide an in-memory computation method and an apparatus having a compact size, a cost-effective manufacturing and an energy-saving working operation.

Further embodiments provide methods and apparatus according to the following aspects are providing convolutional computing techniques with floating gate transistor-based memory cells. The non-linearity of the floating gate transistors (control voltage vs. output current) is overcome by converting threshold voltages to time durations and by performing the convolutional computations depending on these time durations.

According to an embodiment, it is proposed a method for convolutional computing input values with weight factors of a convolutional matrix operator, comprising programming floating gate transistors belonging to non-volatile memory cells to multilevel threshold voltages respectively corresponding to said weight factors. The method comprises performing a sensing operation of the programmed floating gate transistors with a control signal adapted to make the corresponding cells become conductive at an instant determined by the respective programmed threshold voltages, and performing the convolutional computation by using said input values during the elapsed time for each memory cell to become conductive, and outputting output values resulting from the convolutional computation.

The expression "multilevel threshold voltages" means that more than two levels of threshold voltages are used in the memory cells.

In other words, the method according to this embodiment proposes to use as a result, according to the input values, the elapsed time for a memory to switch conductive. In response to the voltage ramp, this time duration is directly determined by the programmable threshold voltage, and permits to materialize the result of the multiplication operations. The products results are accumulated so as to form the multiply and accumulate sequence at the same time as the sensing operation.

Accordingly, the non-volatile memory cells are not conventionally used to store binary data. The binary data would classically be read during a sensing phase, then transmitted to a processing unit and computed by the processing unit, in classical methods that are accordingly time and energy consuming. Instead, the method according to this embodiment uses the behavior of non-volatile memory cells with respect to the sensing operation, so as to obtain in real-time the result of the computation configured thanks to the programming of the memory cells.

The method according to this embodiment is highly resilient to temperature variation since it uses the threshold voltages of the floating gate transistor, which variation caused by temperature can be easily predicted and managed. Moreover, the method does not use current conversion and thus does not need complex and large circuitry to be accurate and efficient. Quite the opposite, the method according to this embodiment uses a control signal and the sensing of a conductive state, which are typically already provided and well mastered in floating gate transistor non-volatile memory designs and operations. An additional accumulator can be advantageously embodied in a very effective, simple and compact manner.

According to an embodiment, performing the convolutional computation comprises performing a multiply and accumulate sequence on all the input values for each output value, and, for each multiply and accumulate sequence, the product values of the multiplication operations of one input value by a respective weight factor are obtained from the elapsed time for the respective memory cell to become conductive in response to the control signal, all the product values being provided in parallel and accumulated together during the sensing operation.

Advantageously, the control signal is a voltage ramp control signal applied on the control gates of the programmed floating gate transistors.

A voltage ramp applied on the control gates is indeed a simple and efficient manner to generate a control signal adapted to make the corresponding cells become conductive at an instant determined by the respective programmed threshold voltages.

According to an embodiment, the sensing operation ends when an amplitude threshold of the voltage ramp control signal is reached, the amplitude threshold corresponding to the maximum value of the multilevel threshold voltages.

Thus, at the end of the multiply and accumulate sequence, all the possible threshold voltages have been reached, corresponding to the minimal time to be sure that all the information stored by the threshold voltages is sensed. The multiply and accumulate sequence is accordingly completed during the time of the sensing operation.

According to an embodiment, the voltage ramp comprises voltage steps, each voltage step amounting to a respective threshold voltage level of the multilevel threshold voltages.

This embodiment is advantageous in particular regarding the discrimination of an effective level among the multilevel threshold voltages.

According to an embodiment, the sensing operation comprises sensing a non-conductive or conductive state of the memory cells by comparing a current driven by each memory cell to a reference current.

Thus, the currents are working at a constant intensity value, i.e. the intensity of the reference current. Accordingly, a temperature variation of the working intensity would impact all the floating gate transistors in the same manner, and would consequently be easily predictable (e.g. detectable) and manageable.

According to an embodiment, each memory cell and each respective weight factor are dedicated to a unique pair of one input value and one output value.

This embodiment corresponds to a convolutional computation mathematically expressible as a matrical product of a matrix and a vector of input values.

According to another embodiment, each memory cell and each respective weight factor are dedicated to a number of pairs of one input value and one output value equal to a row's dimension, or by transposition a column's dimension, of an input matrix comprising the input values, and to a column's dimension, or by the respective transposition a row's dimension, of an output matrix of the output values.

This embodiment corresponds to a convolutional computation mathematically expressible as a matrical product of a matrix and a matrix of input values.

According to an embodiment, performing the convolutional computation comprises generating a clock signal at a frequency configured to pulse a number of clock cycles equal to the number of possible multilevel threshold voltages over the duration of the sensing operation, and, for each memory cell, as long as the memory cell is sensed as being in the non-conductive state, accumulating the corresponding input value on the corresponding output sum value, periodically at each clock cycle of the clock signal.

In other words, in the method according to this embodiment, the elapsed time for each memory cell to become conductive provides the product values by enabling or blocking each input value to integrate a total accumulation at each clock cycle. Thus, one input value is added to the accumulation of one output value a number of times equaling the number of occurrences of clock cycles during the duration for the memory cell to become conductive.

Advantageously, generating the voltage steps comprises increasing a step at each clock cycle of the clock signal.

This is an efficient manner for generating the steps of the voltage ramp control signal in conjunction with the sensing operation providing the multiply and accumulate sequence.

Advantageously, sensing the non-conductive or conductive state comprises delivering an enable signal while the memory cell is in a non-conductive state, the enable signal controlling a logical AND operation to deliver the corresponding input value to accumulate on the corresponding output sum value.

This is a simple, compact and efficient manner for enabling or blocking the input value to integrate the total accumulation.

Advantageously, accumulating the corresponding input value on the corresponding output value comprises looping back a current output value to an input of a full adder operation additionally receiving the input values, the current output value being delivered by a flip flop circuit cadenced by the clock signal and receiving the resulting sum of the full adder operation.

This is a simple, compact and efficient manner for performing the accumulations of the outputs. Full adder operators are compact circuits that can be easily repeated to extend the calculation capability without largely increasing the costs and surface.

According to an alternative embodiment, performing the convolutional computation comprises, for each input value, generating a clock signal configured to have clock cycles at a frequency equating to the input value, cadencing a counting operation of the elapsed time for each memory cell to become conductive, by the clock signal corresponding to the respective input value, and accumulating each counted elapsed time of the memory cells to the corresponding output sum values.

In other words, in the method according to this alternative, the elapsed time for each memory cell to become conductive is counted according to a frequency equating to the input values, so as to directly provide the product values by the count result. One full adder operation of the counts then provides the output values of the multiply and accumulate sequence.

According to another alternative embodiment, performing the sensing operation comprises, for each input value, generating a voltage ramp control signal having a slope that varies according to the corresponding input value, applying each voltage ramp control signal to the memory cells corresponding to the respective input value, and performing the convolutional computation comprises generating a reference clock signal having clock cycles at a frequency adapted to actual time measurement, for each memory cell, cadencing by clock cycles of the reference clock signal a counting operation of the elapsed time for the memory cell to become conductive, and accumulating each counted elapsed time of the memory cells to each respective output values.

In other words, in the method according to this other alternative, the elapsed time for each memory cell to become conductive results intrinsically from the product of the inverse of the slope times the threshold voltage, and is directly measured by a counting operation based on a reference frequency, so as to directly provide the product values. One full adder operation of the counts then provides the output values of the multiply and accumulate sequence.

Advantageously in these alternative embodiments, a stop signal can be generated for each memory cell when the memory cell has become conductive, the stop signal terminating the corresponding counting operation.

In other words, the counts according to each of these alternative embodiments are stopped when the enable signal is deactivated, i.e. when the memory cell switches conductive.

According to another embodiment, an integrated circuit comprises input means for receiving input values, floating gate transistors belonging to non-volatile memory cells and having multilevel threshold voltages respectively corresponding to weight factors of a convolutional matrix operator, a sensing circuit configured to perform a sensing operation of the floating gate transistors with a control signal adapted to make the corresponding cells become conductive at an instant determined by the respective threshold voltages, and a processing circuit configured to perform a convolutional computation of said input values with said weight factors by using said input values during the elapsed time for each memory cell to become conductive, and to supply output values resulting from the convolutional computation.

According to an embodiment, the processing circuit is configured to perform a multiply and accumulate sequence on all the input values for each output value, and the processing circuit is configured, for each multiply and accumulate sequence, to obtain the product values of the multiplication operations of one input value by a respective weight factor according to the elapsed time for the respective memory cell to become conductive in response to the control signal, and to provide in parallel and accumulate together all the product values during the sensing operation.

According to an embodiment, the sensing circuit is configured to generate the control signal having a voltage ramp form and to apply the control signal to the control gates of the floating gate transistors.

According to an embodiment, the sensing circuit is configured to end the sensing operation when an amplitude threshold of the voltage ramp control signal is reached, the amplitude threshold corresponding to the maximum value of the multilevel threshold voltages.

According to an embodiment, the sensing circuit is configured to generate the voltage ramp control signal comprising voltage steps, each step amounting to a respective threshold voltage level of the multilevel threshold voltages.

According to an embodiment, the sensing circuit is configured to detect the instant at which a memory cell becomes conductive by comparing a current driven by each memory cell to a reference current.

According to an embodiment, each memory cell and each respective weight factor are dedicated to a unique pair of one input value and one output value.

According to another embodiment, each memory cell and each respective weight factor are dedicated to a number of pairs of one input value and one output value equal to a row's dimension, or by transposition a column's dimension, of an input matrix comprising the input values, and to a column's dimension, or by the respective transposition a row's dimension, of an output matrix comprising the output values.

According to an embodiment, the processing circuit is configured to generate a clock signal at a frequency configured to pulse a number of clock cycles equal to the number of possible multilevel threshold voltages over the duration of the sensing operation, and, for each memory cell and as long as the memory cell is sensed as being in the non-conductive state, to accumulate the corresponding input value on the corresponding output value, periodically at each clock cycle of the clock signal.

Advantageously, the sensing circuit is configured to generate the voltage steps comprising a step increase at each clock cycle of the clock signal.

Advantageously, the sensing circuit is configured to deliver an enable signal while the memory cell is in a non-conductive state, and the input means comprises a series of AND logical gate circuits each configured to receive an input value and to be controlled by the corresponding enable signal, the outputs of the AND logical gate circuits being configured to deliver the corresponding input value to accumulate on the corresponding output sum value.

Advantageously, the processing circuit comprises a flip flop circuit configured to be cadenced by the clock signal for outputting a current output value received from a full adder circuit, the full adder circuit being configured to sum the input values and the current output value looped back from the flip flop circuit.

According to an alternative embodiment, the processing circuit comprises, for each input value, a clock generator configured to generate a clock signal at a frequency equating to the respective input value, and a counter circuit configured to be cadenced by the corresponding clock signal for counting the elapsed time for each corresponding memory cell to become conductive, the processing circuit being configured to accumulate each counted elapsed time of the memory cells to each respective output sum values.

According to another alternative embodiment, the sensing circuit is configured, for each input value, to generate a control signal in a voltage ramp form having a slope that varies according to the corresponding input value, and to apply each voltage ramp control signal to the memory cells corresponding to the respective input value, and the processing circuit is configured to generate a reference clock signal at a frequency adapted to actual time measurement, and comprises a counter circuit configured to be cadenced by the clock signal for counting the elapsed time for each corresponding memory cell to become conductive, the processing circuit being configured to accumulate each counted elapsed time of the memory cells to each respective output values.

Advantageously, the sensing circuit is configured to generate a stop signal for each memory cell when the memory cell has become conductive, the stop signal terminating the count of the corresponding counter circuit.

BRIEF DESCRIPTION OF THE DRAWINGS

Other advantages and features of the invention shall appear from an examination of the detailed description of non-limitative embodiments of the invention, and of the drawings annexed thereto on which:

FIG. 1 illustrates an example of artificial neural network;

FIG. 2 illustrates a convenient mathematical expression for a convolutional computations CNVL;

FIG. 3 illustrates a mechanism of a floating gate transistor based non-volatile memories;

FIG. 4 shows a method and device according to embodiments;

FIG. 5 shows a method and device according to other embodiments;

FIG. 6 illustrates a mathematical expression of a corresponding complete convolutional computing;

FIG. 7 illustrates an example application of an artificial neural network according to embodiments;

FIGS. 8-9 illustrate an embodiment for introducing negative weight factor values according to embodiments;

FIG. 10 shows managing a change of dimension between the input layer and the output layer according to embodiments;

FIG. 11 shows a method for performing in-memory computation of a matrical product of two matrix operators according to embodiments;

FIG. 12 shows a method and device according to further embodiments; and

FIG. 13 shows a method and device according to yet further embodiments.

DETAILED DESCRIPTION OF ILLUSTRATIVE EMBODIMENTS

FIG. 1 illustrates an example of artificial neural network, comprising layers of "neurons" A1-An, B1-Bm, C1-Cn, . . . Y1-Yn and Z1-Zn, wherein each neuron is connected to all the neurons of the preceding layer by a respective number of "synapses". This biomimetic wording illustrates the mechanism of the calculation involved in this technical field, wherein all the values of an input space (e.g. neurons A1-An of the first layer) are weighted thanks to weight factors (i.e. synapses) and accumulated for each value of an output space (e.g. neurons B1-Bm of the second layer). Such a calculation is called a convolutional computation CNVL. Of course, input spaces and output spaces are composed of a finite number of values (neurons), and the dimension of these spaces (i.e. the number n, m of neurons) can vary from an input space to an output space. Accordingly, dimension of the layer A1-An is n, while the dimension of the layer B1-Bm is m, and m can be different than n.

FIG. 2 illustrates a convenient mathematical expression for such convolutional computations CNVL, suitable for artificial neural networks. The expression is basically a convolutional matrix operator MTXOP applied to an input vector VECTIN and resulting in an output vector VECTOUT. The matrix operator MTXOP has coefficients W11-Wmn set in accordance with the weight values (i.e. synapses), while the input vector VECTIN has the input values A1-An of the first layer, and the output vector VECTOUT has the values B1-Bn of the second layer.

Each output value Bi is thus obtained by a respective multiply and accumulate sequence MACi on the input values Aj according to a dedicated coefficient Wij. Consequently, each weight factor Wij is dedicated to a unique pair of one input value Aj and one output value Bi.

FIG. 3 illustrates a mechanism peculiar to a floating gate transistor based non-volatile memories, responsive to a sensing operation SNS, that will be exploited to perform an in-memory convolutional computation.

A non-volatile memory cell NVMij, such as EEPROM ("Electrically Erasable and Programmable Read Only Memory"), is schematically depicted on the right side of FIG. 3 by a floating gate transistor FGT scheme included in a memory array NVMARR. Classically, the memory cell includes an access transistor coupled in series with the floating gate transistor, for the purpose of selecting the cell. The floating gate transistor FGT comprises a control gate CG and a floating gate FG, and can be programmed by injecting positive or negative charges in the floating gate FG, typically by "hot carrier" and/or Fowler-Nordheim injection mechanisms. In consequence, the threshold voltage viewed from the control gate CG of the transistor FGT is negatively or positively shifted.

A typical sense amplifier SA is able to sense whether the memory cell NVMij is conductive (binary "1" value) or not (binary "0" value), at a given control gate voltage VCG, by comparing the current ICELL flowing through the conduction terminals of the transistor FGT with a reference current IREF. Classically, memory cells NVMij are intended to store a binary value according to a threshold voltage programmed below or above a reference threshold voltage.

Instead of programming memory cells NVMij with one of two possible values, embodiments of the method for convolutional computation is based on programming the floating gate transistors FGT of the non-volatile memory cell NVMij according to multilevel threshold voltages MLTLVL, as depicted on the left side of FIG. 3.

Conventional programming techniques exist or are easily adaptable by the skilled person to implement multilevel programming. The terms "multilevel threshold voltages" mean strictly more than two possible threshold voltages, for example eight discriminable narrow gaussian distributions of threshold voltages Vth 0-1-2-3-4-5-6-7. Due to a misuse of language, one discriminable gaussian distributions of threshold voltages will be referred to as one "threshold voltage".

The graphs on the left side of FIG. 3 show a voltage ramp VRMP applied as a control signal VCG to the control gate CG of the transistor FGT.

Another control signal can be chosen instead of such a voltage ramp, as long as the chosen control signal is adapted to make the corresponding cells to become conductive at an instant determined by the respective programmed threshold voltages. For instance, the control signal might have a slightly logarithmic progression shape. A voltage ramp VRMP applied to the control gates is accordingly a simple and efficient manner to generate the control signal.

The slope value 1/L of the voltage ramp control signal VRMP is expressed by its inverse L, for more convenience as it will appear later.

In response to the voltage ramp control signal VRMP, the transistor FGT flows a current ICELL according to an exponential shape, taking off when VCG approaches the programmed threshold voltage value of the sensed transistor FGT.

The sense amplifier SA is thus configured to detect the time T at which the threshold voltage Vth is reached by comparing a suitable reference current IREF for this purpose. According to an embodiment, the sense amplifier SA is configured to deliver an enable signal EN at high level (i.e. logic state "1" or "true") when the memory cell comprising the floating gate transistor is not conductive and disable the enable signal by setting it at low level (i.e. logic state "0" or "false") when the cell becomes conductive.

Accordingly, the instant T when the floating gate transistor's cell switches from a non-conductive state to the conductive state can be detected. This instant T depends on the slope 1/L of the voltage ramp control signal VRMP and on the programmed threshold voltage Vth[0-7], as expressed at the top right of FIG. 3, 1/L*T=Vth and thus L*Vth=T.

Thus, for example (corresponding to embodiment described in relation with FIGS. 12 and 13) the factors L and Vth could be set in accordance with one input value Aj and one corresponding weight factor value Wij, namely L=Aj and Vth=Wij. Thus, the sensing operation would give the value T, called Tj, of the multiplication operation Wij*Aj=Tj in the multiply and accumulate sequence MACi depicted by FIG. 2.

Contrary to classical multiplication where a binary coded value is read from the memory, transferred to a computation unit and computed by the computation unit, here the result is inherently provided by and during the sensing of the cell, and is thus considered a real-time in-memory computation. In addition to the gain in time in performing the convolutional computation, this also permits to reduce the energy consumed by the computation unit and by the transmission of signals through usually long data lines or buses.

Embodiments of the method accordingly use the elapsed time T (also termed "duration" in the following) for a group of memory cells to become conductive in response to the voltage ramp control signal VRMP, each memory having been programmed so as to exhibit a threshold voltage representative of a weight factor Wij of the convolutional matrix operator MTXOP, in order to provide the value of each product of the input values A1 . . . An by a respective weight factors Wi1 . . . Win.

FIGS. 4, 5 and 6 show a preferred embodiment to perform the latter.

FIG. 4 is directed to the embodiment of the method while FIG. 5 is directed to the embodiment of the device, however FIGS. 4 and 5 will be described together and depict an example of in-memory computing one output value Bi according to four input values A1, A2, A3, A4 and respective weight factors Wi1-Wi4 of the matrix operator MTXOP.

The floating gate transistor's multilevel threshold voltages Vthij ($1 \leq j \leq 4$) of the respective memory cells NVMij were previously programmed according to the weight factors Wij ($1 \leq j \leq 4$) corresponding to this computation. The memory cells NVMij used for the computation of the multiply and accumulate sequence MACi are called "selected memory cells".

Firstly, as visible in FIG. 4, the voltage ramp control signal VRMP is advantageously generated by voltage steps, each voltage step amounting to a respective threshold voltage level (Vth 0 . . . 7) of the multilevel threshold voltages MLTLVL. The slope of a corresponding reconstituted ramp is still expressed by the inversed value 1/L.

The voltage ramp control signal VRMP is communally applied to the control gates CG of the floating gate transistors FGT of the selected memory cells NVMij, which are each continuously sensed in a non-conductive state or in a conductive state.

For that purpose, with reference to FIG. 5, a sensing circuit SNSCRC comprises a voltage ramp generator configured to generate the voltage ramp control signal VRMP, and sense amplifiers circuits SA1-SA4 connected to each respective selected memory cell. The sense amplifiers SA1-SA4 can be connected to the memory cells according to a classical non-volatile memory architecture, e.g. typically through bit lines, as well as the decoding techniques for accessing the selected cells in the memory array NVMARR.

In this embodiment, a clock signal CK having clock cycles CK_0 . . . CK_7 is generated in order to cadence the multiply and accumulate sequence MACi during the sensing operation SNS. The voltage steps are advantageously generated so as to increase by one step at each clock cycle CK_0 . . . CK_7 of the clock signal CK.

The sensing operation SNS is performed by a respective number of sense amplifiers SA1-SA4 comparing a current ICELL driven by each selected memory cell to a reference current IREF as previously described with reference to FIG. 3. The sense amplifiers SA1, SA2, SA2, SA4 each generate a corresponding enable signal EN1, EN2, EN3, EN4, at an enabling high level when the cell is not conductive (i.e. ICELL<IREF), and at a disabling low level when the cell is conductive (i.e. ICELL>IREF).

The multiply and accumulate sequence MACi is performed during the sensing operation SNS as follows: for each selected memory cell, as long as the corresponding enable signal EN1-EN4 is at the enabling high level, the corresponding input value A1-A4 is accumulated on the corresponding output value Bi, periodically at each clock cycle CK_0 . . . CK_7 of the clock signal CK.

Accordingly, in the example depicted by FIG. 4, the first input value A1 is accumulated once while its respective enable signal EN1 is high, during the clock cycle CK_1. The second input value A2 is accumulated six times while its respective enable signal EN2 is high, during the clock cycles CK_1 to CK_6. The third input value A3 is accumulated four times while its respective enable signal EN3 is high, during the clock cycles CK_1 to CK_4. The fourth input value A4 is accumulated twice while its respective enable signal EN4 is high, during the clock cycles CK_1 and CK_2.

Consequently, at the end of the sensing operation SNS, i.e. at the end of the last clock cycle CK_7, the total accumulated input values are S7=1*A1+6*A2+4*A3+2*A4, which corresponds to the real-time computed result of the multiply and accumulate sequence MACi. Weight factors 1, 6, 4, and 2 are each provided by the programmed threshold voltage Vi1-Vi4 of the respective memory cell, with respect to the slope value 1/L, i.e. Vi1×L=1; Vi2×L=6; Vi3×L=4; Vi4×L=2.

For example, the sensing operation SNS performing the multiply and accumulate sequence MACi ends when a threshold maximum amplitude Vthmax of the voltage ramp control signal VRMP is reached, the threshold amplitude corresponding to the maximum value of the multilevel threshold voltages Vthmax. Accordingly, in the present example, the maximum value of the multilevel threshold voltages Vthmax is the seventh threshold voltage, the corresponding step of which is reached at the end of the seventh clock cycle CK_7.

For the purpose of performing this real-time computation of the multiply and accumulate sequence MACi, the embodiment depicted by FIG. 5 is provided with a processing circuit MACCRC, which includes the sensing circuit SNSCRC.

The processing circuit MACCRC comprises a series of AND logical gate circuits each configured to receive an input value A1, A2, A3, A4, each coded on three bits for instance. Each AND logical gate circuit is controlled by the corresponding enable signal EN1, EN2, EN3, EN4. Accordingly, each AND logical gate circuit is configured to deliver the respective input value A1-A4 only if the respective enable signal EN1-EN4 has the enabling high level. The outputs of the AND logical gate circuits deliver the corresponding 3-bit input values A1-A4 to be accumulated by a full adder circuitry FACRC.

The full adder circuitry FACRC comprises a series of full adder elements FA(×3)-FA(×8), each configured to receive a binary coded value on a given bit size, and to output the binary coded value resulting from the addition of the received values, taking into account the carry, on another bit size. In the example of FIG. 5, input values A1-A4 are coded on three bits and input to 3-bit full adders FA(×3) which output 4-bit sum values. The 4-bit sum values are input to a 4-bit full adder FA(×4) which outputs a 5-bit sum value. The 5-bit sum value is input to an 8-bit full adder FA(×8) which outputs a 8-bit value.

The full adder circuitry FACRC also comprises a flip flop circuit FF configured to be cadenced by the clock signal CK for outputting a current output value Sk received from the 8-bit full adder FA(×8). The current output value Sk is looped back from the flip flop circuit FF to the 8-bit full adder FA(×8). Thus, at each clock cycle, the current total sum Sk is accumulated with each input value A1-A4 having its respective enable signal EN1-EN4 at the enabling high level.

The last current value Sk, k=7, is the result of the multiply and accumulate sequence MACi, and the value of one output value Bi in the output vector VECTOUT.

In other words, the processing circuit MACCRC, which permits in this embodiment to perform the in-memory computation, i.e. to perform the multiply and accumulate sequence MACi in real-time during the sensing operation SNS, advantageously uses logical operations on digital values.

Thus, although being located on the periphery of the memory array NVMARR, the processing circuit MACCRC requires only a small footprint. Indeed, the AND logical gates, as well as the full adder circuitry FACRC, are extremely compact. The full adder circuits FA(×3)-FA(×8) and the flip flop circuit FF are very well mastered and optimized circuits running on a convenient logical level voltage, thus comprising very compact components.

Moreover, the digital calculations are highly reliable for instance with respect to temperature variations, and are not constrained by analog calibration.

Also, increasing the number of input values and/or increasing the bit size for coding the input values can be achieved at a large scale with no particularly harmful impact.

With reference to FIGS. 4 and 5, the method applied to one output value Bi of the convolutional computing has been shown.

FIG. 6 illustrates the mathematical expression of the corresponding complete convolutional computing, for an input vector VECTIN having four dimensions (input layer having four neurons) and an output vector VECTOUT also having four dimensions (output layer also having four neurons). The matrical operator MTXOP is consequently of the dimension 4×4=16 (sixteen synapses).

Each weight value of the matrical operator MTXOP is the product of the programmed floating gate transistor's threshold voltage Vij of a respective memory cell NVMij times the inversed slope L of the common voltage ramp control signal VRMP.

Generalizing, with reference to FIG. 1, to n-dimensional input and output vectors, $n^2$ synapses are connecting one neuronal layer to the other. Consequently, embodiments are provided with $n^2$ sense amplifiers to perform all the multiply and accumulate sequences in one sensing operation. For instance, if n=16, 256 sense amplifiers are provided.

Such a number of sense amplifiers is compatible with current non-volatile memories architectures and can be increased with no particular constraints.

Also, for example in an actual non-volatile memory having 256 k addresses (i.e. 256 k memory cells) the embodiments allow one thousand neuronal layers of sixteen neurons each to be computed, with no interruptions for writing memory cells.

FIG. 7 illustrates an embodiment according to the embodiment previously described in relation with FIGS. 4 and 5, permitting to compute the four output values B1, B2, B3, B4 of the output vector VECTOUT at once.

Basically, in this embodiment, the processing circuit MACCRC comprises a replica of the full adder circuitry FACRC, AND logical gate circuits, and sensing circuit SNSCRC of FIG. 5 per output value B1, B2, B3, B4. In other words, four replicas of FIG. 5 are provided, each receiving the same input values A1, A2, A3, A4, but accessing different memory cells NVMij depending on the weight factors Wij corresponding to each unique pair of one input value Aj and one output value Bi.

FIG. 7 also illustrates an example system application of an artificial neural network, where the neurons of the output layer B1-B4 are processed through a nonlinear activation function before being used as inputs A1-A4 of a next convolutional computation.

The method and apparatus are providing in-memory calculation for each convolution, and modifying the matrical operator can be performed by accessing the addresses of another set of non-volatile memory cells in the memory array NVMARR, thanks to a decoding circuit DEC classically used in non-volatile memories.

Similarly, in the context of so-called artificial intelligence or machine learning, making the weight values Wij of the matrix operator (i.e. synapses) evolve between computations from one layer to the next can be easily achieved thanks to classical writing operations of the non-volatile memory cells NVMij.

FIGS. 8 and 9 illustrate an embodiment for introducing negative weight factor values in the method for convolutional computation.

In the computation of each output value Bi, here for example B1, positive weight values WP1j and negative weight values WN1j are introduced by assuming the contribution of two synapses. Accordingly, the multiply and accumulate sequence calculating B1, as described in relations with FIGS. 4 and 5, is performed first using positive synapses having positive weight factors WP11, WP12, WP13, WP14 and a second time using negative synapses having negative weight factors WN11, WN12, WN13, WN14.

The resulting output value B1 is obtained by subtracting the negatively weighted accumulation (sum over j of WN1jAj) from the positively weighted accumulation (sum over j of WP1jAj).

For that purpose, in the embodiment of FIG. 9, after having performed the positively weighted accumulation, sense amplifiers SA1-SA4 are switched to another set of memory cells storing the negative weights VN1j (i.e. switching to negative synapses), and again performs the multiply and accumulate sequence on the basis of the negative weights VN11=5, VN12=3, VN13=6, VN14=3. The accumulated result is subtracted from the previous accumulated result S7=1*A1+6*A2+4*A3+2*A4 (from the example of FIGS. 4 and 5, which is reproduced here) resulting in a final results B1=S−4*A1+3*A2−2*A3−1*A4.

A sign signal SGN causes the last full adder circuit FA/S(×8) to switch from an addition operation to a subtraction operation. Also, the sign signal SGN triggers the switching of the accessed addresses of the memory cells.

This example serial embodiment can be performed in parallel by doubling the number of sense amplifiers SA1-SA4 instead of switching them.

Also, neurons can assume negative values, since the embodiments remain compatible with the digital coding method of negative values, such as for instance the two's complement method.

FIG. 10 shows an embodiment managing a change of dimension between the input layer and the output layer.

As previously mentioned in relation with FIG. 1, neuronal layers can be of different dimensions. For instance, the dimension of the layer A1-A3 is 3, the dimension of the layer B1-B2 is 2, and the dimension of the layer C1-C3 is 3.

It is considered that neuron B3 is missing in comparison with a 3-dimensional layer and should not be taken into account for the calculation of neurons C1-C3.

Embodiments can manage such dimensional changes for example by a suitable configuration of neuron B3 for instance by zeroing the synapses W31, W32, W33 resulting in zeroing the neuron's B3 value 101, or for example by zeroing the synapses 102 going from B3 to each of C1, C2, C3. Zeroing the synapses 102 can be done for instance by forcing the corresponding sense amplifiers to the off state.

FIG. 11 shows an embodiment of the method to perform in-memory computation of a matrical product of two matrix operators.

The input values are consequently provided in the form of an input matrix MTXIN and comprise N*N input values. The output is provided in a form of an N*N output matrix MTXOUT. However, assuming that a matrical product of two matrices of dimension N*N involves the same calculations as N matrical products of a vector of dimension N with an N*N matrix operator MTXOP, then this embodiment reproduces N times a matrix-vector product as described in relation with FIGS. 2 to 10.

The weight values Wij of the matrix operator MTXOP are thus no longer dedicated to a unique pair of one input value Aj and one output value Bi, but to N pairs of one input value Akj and one output value Bik, $1 \leq k \leq N$.

In other words, in this embodiment related to the product of two matrices, one synapse is used for calculating N neuron output values.

Accordingly, in the depicted example of N=3, 9 input values A11-A33 are input on 9 input digital lines that are selectively activated through the AND logical gate circuits controlled by the enable signals based on the memory cells corresponding to the respective weight values Wij.

Commuting the matrical product, i.e. computing MTXIN×MTXOP or MTXOP×MTXIN can be easily achieved by commuting the weight factors Wij sensed by the sense amplifiers, by rearranging the decoding of the respective addresses of memory cells, and by commuting the transmission of the input values Aij to a respective AND logical gate circuit.

As already expressed, duplicating the full adder circuit FACRC in particular, or more generally duplicating the processing circuit MACCRC, does not involve a consequential supplementary footprint, so this example embodiment can be generalized to higher dimension N values, with no excessive additional cost and footprint.

FIG. 12 illustrates an example of an alternative embodiment to the embodiment described in relation with FIGS. 4 and 5.

In this alternative, a specific voltage ramp control signal VRMP_L is generated for each input value A1 . . . A4 and each voltage ramp control signal VRMP_L is respectively configured to have a slope of variation value 1/L1 . . . 1/L4 corresponding to the input value A1 . . . A4 respectively.

More precisely, with respect to the use of the inverse value L of the slope 1/L, the voltage ramp VRMP_L is generated so that the inverse value Lj of the slope is proportional to the magnitude of the input value Aj.

Each voltage ramp control signal VRMP_L is applied to the selected memory cells NVMij corresponding to the respective input value Aj.

Consequently, the measure of the elapsed time T=Vij*Lj for the memory cell to switch from the non-conductive state to the conductive state provides the result of the multiplication operation Wij*Aj.

Accordingly, the cell is continuously sensed in a manner similar to that previously described in reference with FIG. 3, and the inverse of the enable signal is here used as a stop signal STP for terminating a counting operation performed by a counter circuit CNT. The counting operation CNT starts when the sensing operation SNS starts and is cadenced by clock cycles of a reference clock signal Clk in order to measure the duration T.

The counted duration T of the selected memory cells NVMij corresponding to each input value Aj are properly accumulated, resulting in each respective output values B1 . . . B4 (Bi).

The mathematical expression of the convolutional computation in the bottom right side of FIG. 12, illustrates the mechanism of this alternative, where the input vector A1-A4 is directly converted to inverse slope values L1, L2, L3, L4, each acting with the threshold voltages Vij respective to both an input value Aj and an output value Bi.

Of course, in this alternative, the voltage ramp control signals L=1 . . . L=7 can be generated by steps as mentioned before with reference to FIG. 4.

FIG. 13 illustrates another example of an alternative embodiment to the embodiment described in relation with FIGS. 4 and 5.

In this other alternative, one voltage ramp control signal VRMP is communally applied to the selected memory cells NVMij, similarly with the embodiment of FIGS. 4 and 5. However, the basis of time used for measuring the elapsed time T for each memory cell to become conductive is set for equating to each respective input values.

Thus, continuously sensing a non-conductive or conductive state of each selected memory cell provides an absolute duration which expresses the weight factor value Wij alone.

A clock signal Clk_f is generated for each input value, and is configured to have clock cycles of a frequency f equating to the input value. The counting operation CNT is cadenced by the clock signal Clk_f having the frequency fj corresponding to the respective input value Aj.

Consequently, the respectively cadenced Clk_f measurement of the elapsed time T_f=L*Vth*f for the memory cell to switch from the non-conductive state to the conductive state gives by itself the result of the multiplication operation WijAj.

Each measured elapsed time T of the selected memory cells NVMij corresponding to each input value Aj are properly accumulated, resulting in each respective output values B1 . . . B4 (Bi).

The mathematical expression of the convolutional computation in the bottom right side of FIG. 13, illustrates the mechanism of this alternative where the input values A1-A4 are converted to frequency values f1, f2, f3, f4 and the weight factors are provided thanks to the threshold voltages Vij and the inverse slope value L.

What is claimed is:

1. A method for convolutional computing input values with weight factors of a convolutional matrix operator, the method comprising:
   programming floating gate transistors belonging to non-volatile memory cells to multilevel threshold voltages respectively corresponding to the weight factors;
   performing a sensing operation of the programmed floating gate transistors with a control signal adapted to make the corresponding memory cells become conductive at an instant determined by a respective programmed threshold voltage;

performing the convolutional computation by using the input values during an elapsed time for each memory cell to become conductive; and outputting output values resulting from the convolutional computation.

2. The method according to claim 1, wherein performing the convolutional computation comprises:

performing a multiply and accumulate sequence on all input values for each output value, and obtaining product values of multiplication operations of one input value by a respective weight factor from the elapsed time for the respective memory cell to become conductive in response to the control signal, and wherein all the product values are provided in parallel and accumulated together during the sensing operation.

3. The method according to claim 1, wherein the control signal is a voltage ramp control signal applied on control gates of the programmed floating gate transistors.

4. The method according to claim 3, wherein performing the sensing operation ends when an amplitude threshold of the voltage ramp control signal is reached, the amplitude threshold corresponding to a maximum value of the multilevel threshold voltages.

5. The method according to claim 4, wherein the voltage ramp control signal comprises voltage steps, each voltage step amounting to a respective threshold voltage level of the multilevel threshold voltages.

6. The method according to claim 1, wherein the sensing operation comprises sensing a non-conductive or conductive state of the memory cells by comparing a current driven by each memory cell to a reference current.

7. The method according to claim 1, wherein each memory cell and each respective weight factor are dedicated to a unique pair of one input value and one output value.

8. The method according to claim 1, wherein each memory cell and each respective weight factor are dedicated to a number of pairs of one input value and one output value equal to a row's dimension, or by transposition a column's dimension, of an input matrix comprising the input values, and to a column's dimension, or by the respective transposition a row's dimension, of an output matrix comprising the output values.

9. The method according to claim 1, wherein performing the convolutional computation comprises:

generating a clock signal at a frequency configured to pulse a number of clock cycles equal to a number of possible multilevel threshold voltages over a duration of the sensing operation, and for each memory cell, as long as the memory cell is sensed as being in a non-conductive state, accumulating the corresponding input value on the corresponding output sum value, periodically at each clock cycle of a clock signal.

10. The method according to claim 9, wherein generating voltage steps comprises increasing a step at each clock cycle of the clock signal.

11. The method according to claim 10, wherein sensing the non-conductive or conductive state comprises delivering an enable signal while a memory cell is in a non-conductive state, and wherein the enable signal controls a logical AND operation to deliver the corresponding input value to accumulate on the corresponding output sum value.

12. The method according to claim 9, wherein accumulating the corresponding input value on the corresponding output value comprises:

looping back a current output value to an input of a full adder operation and additionally receiving the input values, the current output value being delivered by a flip flop circuit cadenced by the clock signal, and receiving a resulting sum of the full adder operation.

13. The method according to claim 1, wherein performing the convolutional computation comprises:

for each input value, generating a clock signal configured to have clock cycles at a frequency equating to the input value, cadencing a counting operation of the elapsed time for each memory cell to become conductive, by the clock signal corresponding to the respective input value, and accumulating each counted elapsed time of the memory cells to the corresponding output sum values.

14. The method according to claim 1, wherein performing the sensing operation comprises:

for each input value, generating a voltage ramp control signal having a slope that varies according to the corresponding input value, and applying each voltage ramp control signal to each memory cells corresponding to the respective input value, and wherein performing the convolutional computation comprises:

generating a reference clock signal having clock cycles at a frequency adapted to actual time measurement, for each memory cell, cadencing by clock cycles of the reference clock signal a counting operation of the elapsed time for the memory cell to become conductive, and accumulating each counted elapsed time of the memory cells to each respective output values.

15. The method according to claim 13, further comprising generating a stop signal for each memory cell when the memory cell has become conductive, the stop signal terminating the corresponding counting operation.

16. An integrated circuit comprising:

an input configured to receive input values;

floating gate transistors belonging to non-volatile memory cells and having multilevel threshold voltages respectively corresponding to weight factors of a convolutional matrix operator;

a sensing circuit configured to perform a sensing operation of the floating gate transistors with a control signal adapted to make the corresponding cells become conductive at an instant determined by a respective threshold voltages; and a processing circuit configured to:

perform a convolutional computation of the input values with the weight factors by using the input values during an elapsed time for each memory cell to become conductive, and supply output values resulting from the convolutional computation.

17. The integrated circuit according to claim 16, wherein the processing circuit is configured to:

perform a multiply and accumulate sequence on all the input values for each output value, obtain product values of multiplication operations of one input value for each multiply and accumulate sequence by a respective weight factor according to the elapsed time for the respective memory cell to become conductive in response to the control signal, and provide in parallel and accumulate together all the product values during the sensing operation.

18. The integrated circuit according to claim 16, wherein the sensing circuit is configured to: generate a voltage ramp control signal having a voltage ramp form,
- apply the voltage ramp control signal to the control gates of the floating gate transistors, and
- end the sensing operation when an amplitude threshold of the voltage ramp control signal is reached, the amplitude threshold corresponding to a maximum value of the multilevel threshold voltages.

19. The integrated circuit according to claim 16, wherein the processing circuit is configured to:
- generate a clock signal at a frequency configured to pulse a number of clock cycles equal to a number of possible multilevel threshold voltages over a duration of the sensing operation, and
- for each memory cell and as long as the memory cell is sensed as being in a non-conductive state, accumulate the corresponding input value on the corresponding output value, periodically at each clock cycle of the clock signal.

20. The integrated circuit according to claim 19, wherein the sensing circuit is configured to deliver an enable signal while the memory cell is in a non-conductive state, wherein the input comprises a series of AND logical gate circuits each configured to receive an input value and to be controlled by the corresponding enable signal, and wherein the outputs of the AND logical gate circuits are configured to deliver the corresponding input value to accumulate on the corresponding output sum value.

* * * * *